(12) United States Patent
Lu et al.

(10) Patent No.: US 8,802,569 B2
(45) Date of Patent: Aug. 12, 2014

(54) METHOD OF FABRICATING A SEMICONDUCTOR DEVICE

(75) Inventors: Kuei-Liang Lu, Hsinchu (TW); Ming-Feng Shieh, Yongkang (TW); Ching-Yu Chang, Yilang County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 37 days.

(21) Appl. No.: 13/418,589

(22) Filed: Mar. 13, 2012

(65) Prior Publication Data

US 2013/0244434 A1  Sep. 19, 2013

(51) Int. Cl.
*H01L 21/302* (2006.01)
*C23F 1/00* (2006.01)

(52) U.S. Cl.
USPC ........... 438/692; 438/626; 438/690; 438/691; 438/694; 438/699; 438/780; 438/787; 216/13; 216/41; 216/47; 216/88; 257/E21.58; 257/E21.243; 257/E21.259

(58) Field of Classification Search
USPC .......... 216/13, 41, 47, 88; 438/626, 690, 691, 438/692, 699, 780, 787; 427/99.3; 257/E21.58, E21.243, E21.259; 252/79.1
See application file for complete search history.

(56) References Cited

U.S. PATENT DOCUMENTS

| | | | | |
|---|---|---|---|---|
| 6,020,265 | A * | 2/2000 | Lou | 438/692 |
| 6,153,525 | A * | 11/2000 | Hendricks et al. | 438/692 |
| 6,331,488 | B1 * | 12/2001 | Doan et al. | 438/698 |
| 7,718,525 | B2 * | 5/2010 | Barth et al. | 438/624 |
| 7,772,071 | B2 * | 8/2010 | Chong et al. | 438/285 |
| 8,093,150 | B2 * | 1/2012 | Beck et al. | 438/638 |
| 2008/0136041 | A1 * | 6/2008 | Kotake et al. | 257/774 |

OTHER PUBLICATIONS

Hiller et al., "Low temperature silicon dioxide by thermal atomic layer deposition: Investigation of material properties", Published online on Mar. 29, 2010, Journal of Applied Physics 107, 064314 (2010).*

* cited by examiner

*Primary Examiner* — Nadine Norton
*Assistant Examiner* — Christopher Remavege
(74) *Attorney, Agent, or Firm* — Haynes and Boone, LLP

(57) ABSTRACT

The present disclosure provides a method of fabricating a semiconductor device. The method includes forming a plurality of circuit devices over a substrate. The method includes forming an organic layer over the substrate. The organic layer is formed over the plurality of circuit devices. The method includes polishing the organic layer to planarize a surface of the organic layer. The organic layer is free of being thermally treated prior to the polishing. The organic material is un-cross-linked during the polishing. The method includes depositing a LT-film over the planarized surface of the organic layer. The depositing is performed at a temperature less than about 150 degrees Celsius. The depositing is also performed without using a spin coating process. The method includes forming a patterned photoresist layer over the LT-film.

20 Claims, 8 Drawing Sheets

METHOD OF FABRICATING A SEMICONDUCTOR DEVICE

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

The decreased geometry sizes lead to challenges in semiconductor fabrication. For example, as geometry sizes continue to decrease, fabrication process tolerances are reduced, and the impact from wafer topography variations will limit process windows such as lithography or etching process windows. Traditional fabrication process schemes have not sufficiently addressed these issues caused by wafer topography variations.

Therefore, while traditional lithography methods have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
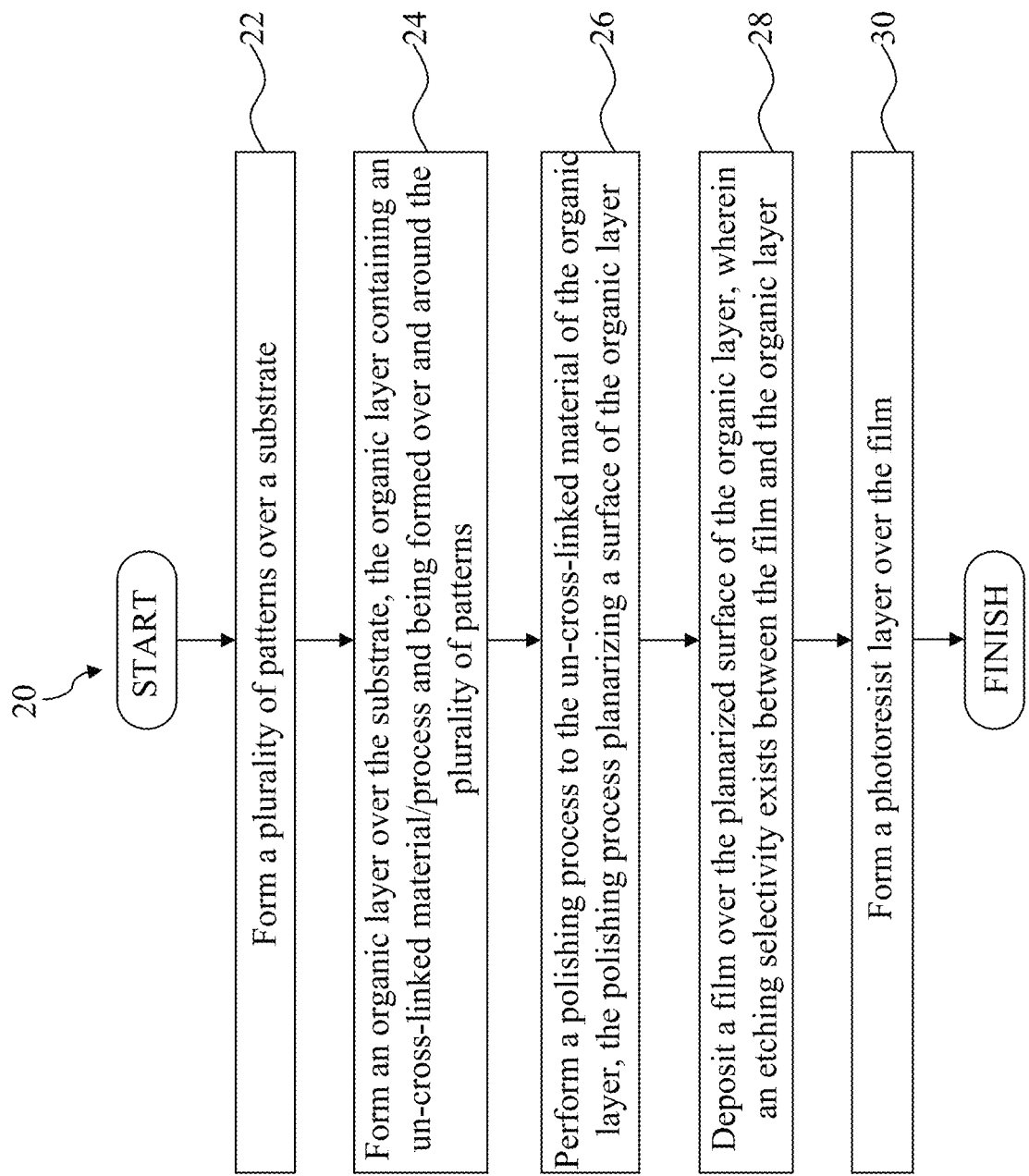
FIG. 1 is a flowchart illustrating a method of fabricating a semiconductor device according to various aspects of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a flowchart of a method 20 for fabricating a semiconductor device. The method 20 begins with a block 22 in which a plurality of patterns is formed over a substrate. The method 20 includes a block 24, in which an organic layer is formed over the substrate. The organic layer containing an un-cross-linked material/process and is formed over and around the plurality of patterns. The method 20 includes a block 26, in which a polishing process is performed to the un-cross-linked material of the organic layer. The polishing process planarizes a surface of the organic layer. The organic layer is not thermally treated before the polishing process is performed. The method 20 includes a block 28, in which a film is deposited over the planarized surface of the organic layer. An etching selectivity exists between the film and the organic layer. In some embodiments, the film is deposited at a temperature ranging from about 30 degrees Celsius to about 120 degrees Celsius. In some embodiment, the film is deposited without spin coating. In some embodiments, the film is deposited to have a thickness in a range from about 10 Angstroms to about 300 Angstroms. The method 20 includes a block 30, in which a photoresist layer is formed over the film.

It is understood that other processes may be performed before, during, or after the blocks 22-30. For example, an etching process may be performed to the film, where the photoresist layer serves as an etching mask during the etching process. Also, in some embodiments, an anti-reflective layer may be formed between the film and the photoresist layer. An etching selectivity exists between the anti-reflective layer, the organic layer, and the film.

FIGS. 2-8 are diagrammatic fragmentary cross-sectional side views of a portion of a semiconductor device 40 at various stages of fabrication in accordance with various aspects of the present disclosure. It is understood that FIGS. 2-8 have been simplified for a better understanding of the inventive concepts of the present disclosure. Accordingly, it should be noted that additional processes may be provided before, during, and after the processes shown in FIGS. 2-10, and that some other processes may only be briefly described herein.

Figure 2:
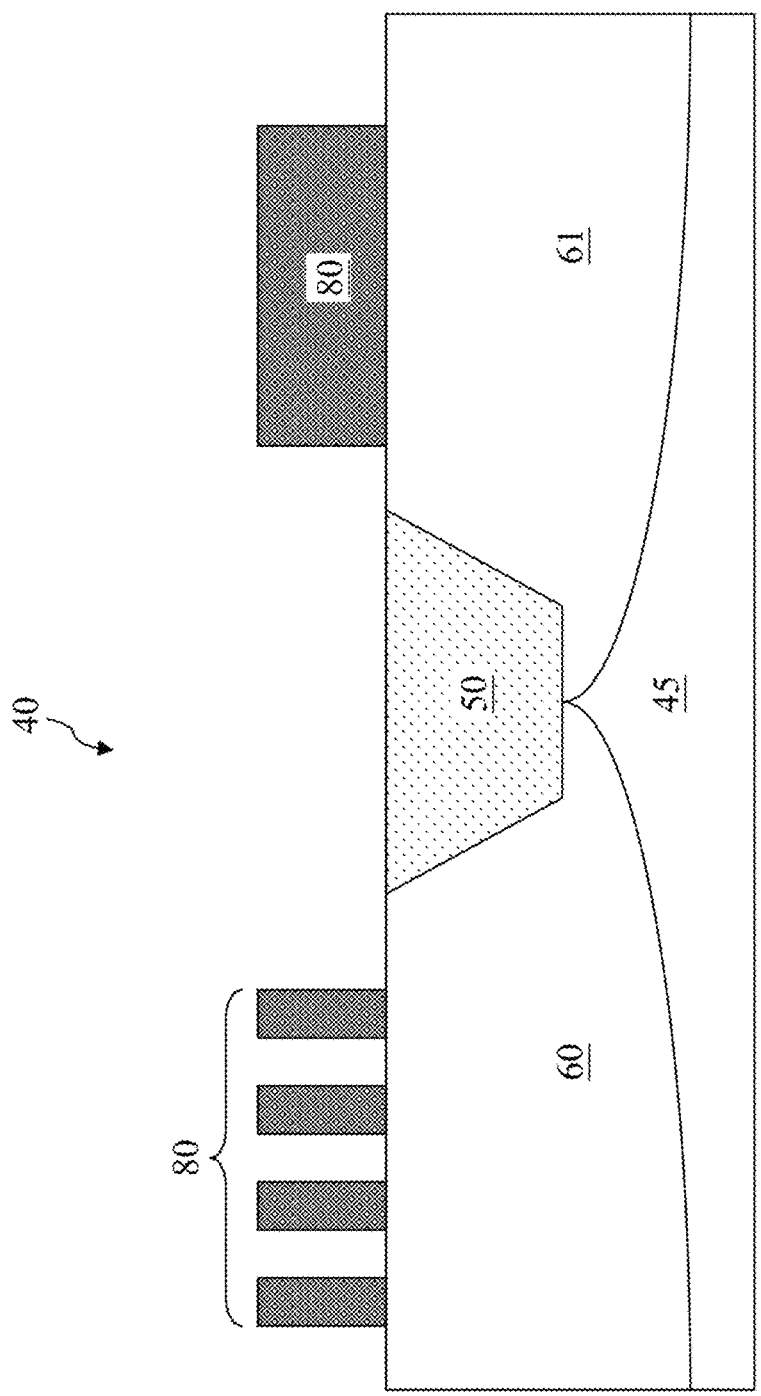
FIGS. 2-8 are diagrammatic fragmentary cross-sectional side views of a semiconductor device at various stages of fabrication in accordance with various aspects of the present disclosure.

Referring to FIG. 2, the semiconductor device 40 may be a semiconductor Integrated Circuit (IC) chip, system on chip (SoC), or portion thereof, that may include memory circuits, logic circuits, high frequency circuits, image sensors, and various passive and active components such as resistors, capacitors, and inductors, P-channel field effect transistors (pFET), N-channel FET (nFET), metal-oxide semiconductor field effect transistors (MOSFET), or complementary metal-oxide semiconductor (CMOS) transistors, bipolar junction transistors (BJT), laterally diffused MOS (LDMOS) transistors, high power MOS transistors, or other types of transistors. It should be noted that some features of the semiconductor device 40 may be fabricated with a CMOS process flow.

The semiconductor device 40 includes a substrate 50. In the embodiment shown, the substrate 50 is a silicon substrate that is doped with a P-type dopant such as boron. In another embodiment, the substrate 50 is a silicon substrate that is doped with an N-type dopant such as arsenic or phosphorous. The substrate may alternatively be made of some other suitable elementary semiconductor material, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. Further, in some embodiments, the substrate 50 could include an epitaxial layer (epi layer), may be strained for performance enhancement, and may include a silicon-on-insulator (SOI) structure.

Isolation structures such as isolation structure 50 are formed in the substrate 45. The isolation structure 50 includes a shallow trench isolation (STI) device. The STI devices contain a dielectric material, which may be silicon oxide, silicon nitride, silicon oxy-nitride, fluoride-doped silicate (FSG), and/or a low-k dielectric material known in the art. The STI devices are formed by etching trenches in the substrate 45 and thereafter filling the trenches with the dielectric material. In other embodiments, deep trench isolation (DTI) devices may also be formed in place of (or in combination with) the STI devices as the isolation structures.

Doped wells such as doped wells 60 and 61 may also formed in the substrate 45. The doped wells 60-61 are formed on either side of the isolation structure 50. In some embodiments, the doped wells 60-61 are doped with an N-type dopant such as arsenic or phosphorous. In some other embodiments, the doped wells 60-61 may be doped with a P-type dopant. The doping may be carried out using an ion implantation process or a diffusion process known in the art.

One or more device patterns 80 are formed over the substrate 45. The device patterns 80 may be components of IC circuit devices, for example polysilicon or metal gates of MOS transistors or other suitable semiconductor features. The device patterns 80 may be formed by one or more deposition and patterning processes. The deposition processes may include chemical vapor deposition (CVD), physical vapor deposition (PVD), atomic layer deposition (ALD), or other suitable deposition processes. The patterning processes may include a lithography process involving one or more masking, exposing, baking, developing, and rinsing processes (not necessarily in that order). One or more of the device patterns 80 may need to undergo further patterning later to form IC circuit device components.

Figure 3:
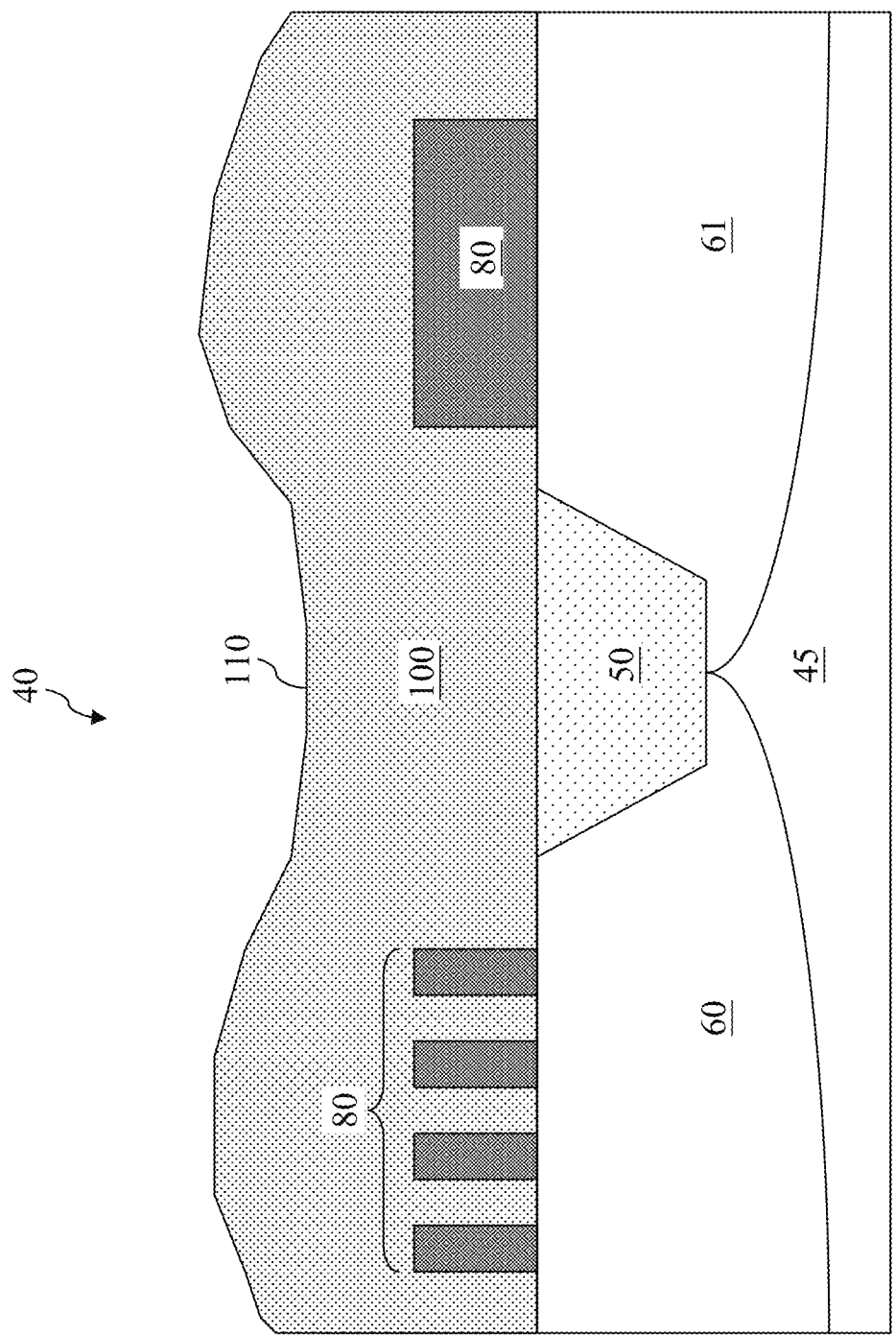

Referring now to FIG. 3, a layer 100 is formed over the substrate 45. The layer 100 is formed over and surrounds the device patterns 80. In some embodiments, the layer 100 may be formed by a spin coating process. In other embodiments, the layer 100 may be formed by another suitable deposition process. The layer 100 contains a material that is patternable. In some embodiments, the layer 100 contains an organic material. The organic material may include a plurality of monomers or polymers that are not cross-linked. As a result, the layer 100 is relatively soft.

As is illustrated in FIG. 3, the layer 100 has an uneven surface 110, which is at least partially a result of being formed over the device patterns 80. In other words, since the device patterns 80 have an inherent height or thickness, the layer 80 may be thicker or taller in portions that are formed over the device patterns 80 than in portions that are formed just over the surface of the substrate 45. The substrate 45 itself may not be entirely flat either, thereby also contributing to the unevenness of the surface 110 of the layer 100. In addition, other factors such as fluctuations in high temperature treatment may also lead to wafer warping or warpage. Due to these factors, the surface 110 of the layer 100 is not flat. This may be referred to as variations in wafer topography, which are undesirable since they impose processing difficulties and/or degrade device performance.

According to various aspects of the present disclosure, the layer 100 constitutes an under layer of a tri-layer patterning scheme. Such tri-layer patterning scheme will be used to perform a lithography process.

Figure 4:
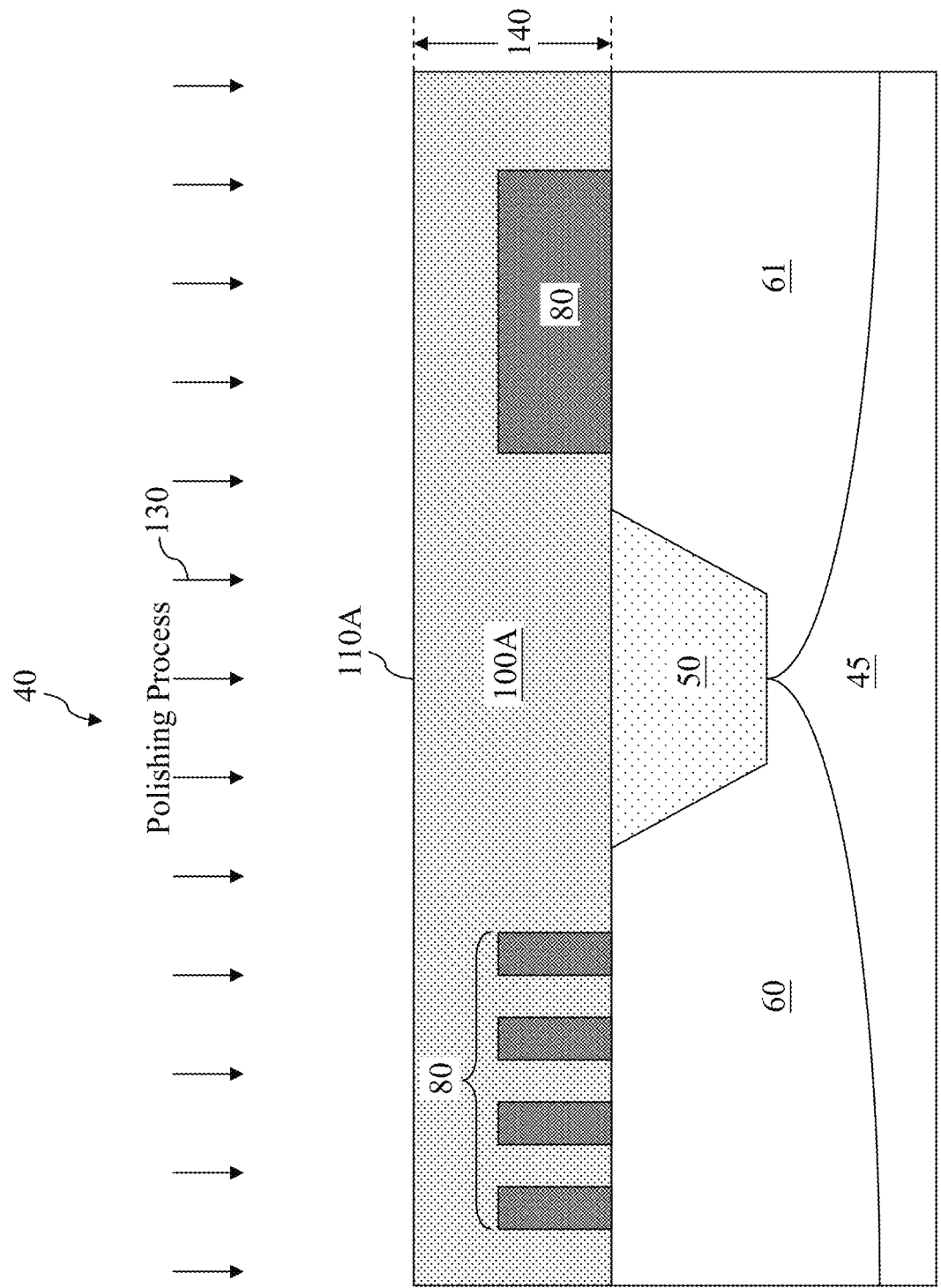

Referring now to FIG. 4, to reduce the variations in wafer topography—in other words, to make the surface 110 of the wafer 100 flatter—a polishing process 130 is performed to the layer 100. In some embodiments, the polishing process 130 includes a chemical-mechanical-polishing (CMP) process. The polishing process 130 grinds away materials of the layer 100 to transform it into a flatter layer 100A. The layer 100A has a substantially flat surface 110A. The layer 100A has a thickness 140.

It is understood that no thermal treatment is performed to the layer 100 before the polishing process 130 is performed. Thermal treatment means that the material being treated is subject to a high temperature, for example a high temperature in the range of a few hundred degrees Celsius. Typically, when an organic material such as the organic material in the layer 100 is subjected to thermal treatment, the molecules in the material such as the monomers or polymers therein will become cross-linked. Cross-linked molecules greatly increase the strength or hardness of the material. Consequently, had the layer 100 been subjected to a thermal treatment process, the materials therein would have been cross-linked, and the layer 100 would have been very hard. However, according to the various aspects of the present disclosure, no thermal treatment process is performed to the layer 100, and the material of the layer 100 remains un-cross-linked due to the absence of thermal treatment. As such, the layer 100 still remains soft.

The fact that the layer 100 is still soft allows it to be polished by the polishing process 130. As discussed above, as a result of the polishing process 130, a substantially flat or planarized surface 110A of the layer 100 is obtained. In comparison, traditional semiconductor fabrication processes usually subject an organic layer to a thermal treatment process, thereby cross-linking its molecules and making the layer too hard to polish. Stated differently, a polishing process like the polishing process 130 would not have been able to be performed to planarize an organic layer's surface in a traditional fabrication process. Once again, the absence of a thermal treatment process for the layer 100 allows its materials to be still un-cross-linked and remain soft at the time of the polishing process 130, which allows the polishing process 130 to form a substantially flat and smooth surface 110A.

Figure 5:
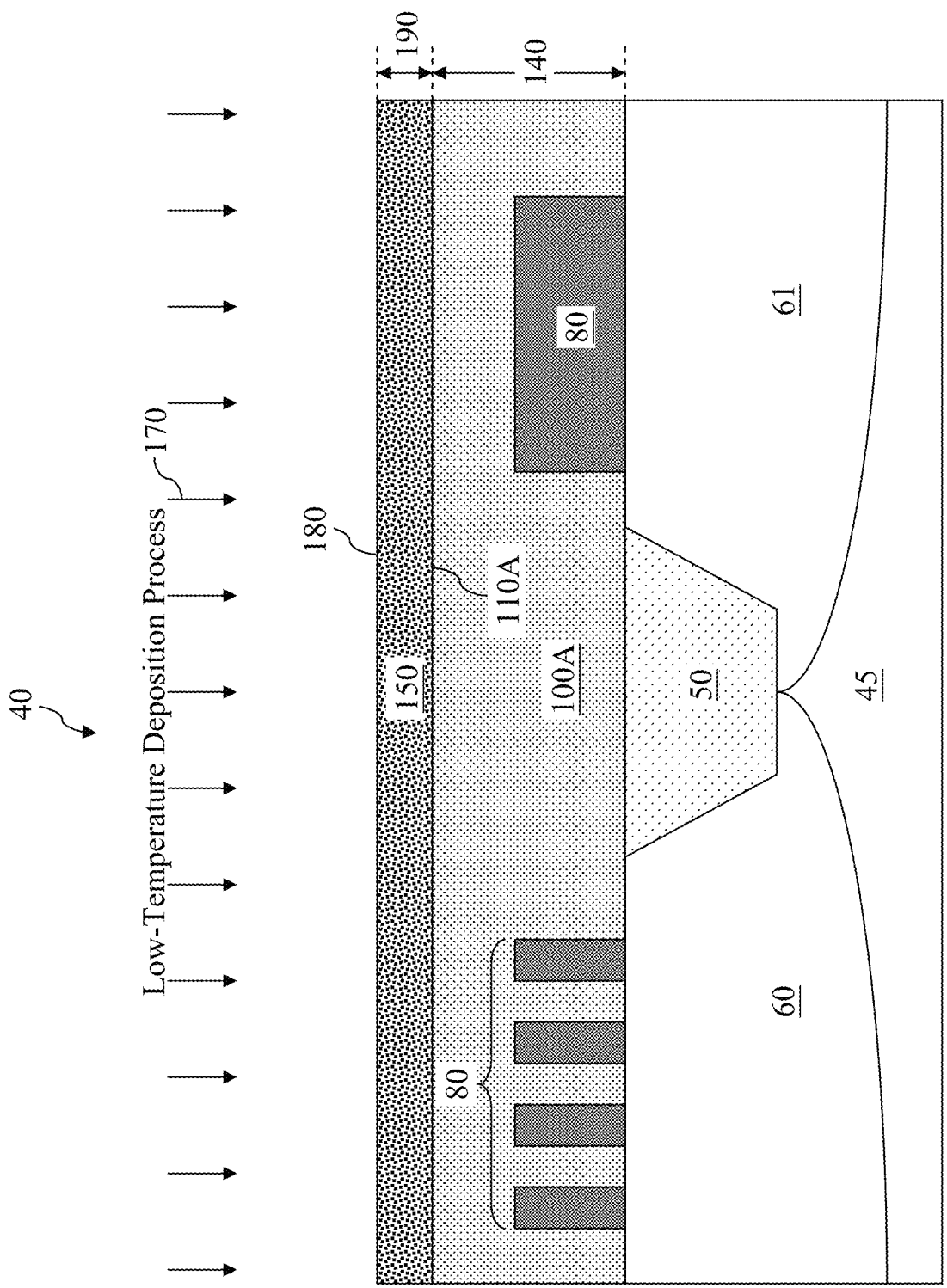

Referring now to FIG. 5, a low-temperature (LT) film 150 is formed as a patternable layer over the planarized or flattened surface 110A of the layer 100 (or the layer 100A). The low-temperature film 150 contains a film with a suitable refractive index (n) and a suitable extinction coefficient (k). In some embodiments, the low-temperature film 150 contains silicon oxide, silicon nitride, or silicon oxynitride.

The low-temperature film 150 is formed without spin-coating. In some embodiments, the low-temperature film 150 is formed by a low-temperature atomic layer deposition (LT-ALD) process 170. The low-temperature deposition process 170 is similar to a CVD process in some aspects, in that a material of the low-temperature film 150 is deposited on the surface 110A in a deposition chamber. However, unlike conventional CVD processes, the low-temperature deposition process 170 is performed at a substantially lower temperature than the temperature associated with most CVD processes or CVD processing chambers.

In some embodiments, the process temperature at which the low-temperature deposition process 170 is performed is less than about 150 degrees Celsius. For example, the process temperature of the low-temperature deposition process 170 is in a range from about 30 degrees Celsius to about 120 degrees Celsius. The low process temperature of the deposition chamber is desirable because a high process temperature deposition chamber would cause photoresist material damage and derive chamber contamination. So using the low-temperature film can solve the chamber contamination problem.

The low-temperature film 150 constitutes a middle layer of the tri-layer patterning scheme of the present disclosure. Many traditional fabrication processes may form a silicon-rich material as the middle layer of a conventional tri-layer patterning scheme. Such silicon-rich material contains a solvent. Had such conventional silicon-rich middle layer been implemented instead of the low-temperature film 150, the solvent in the silicon-rich middle layer will likely leak or permeate into the under-layer 100A, since the under-layer 100A is still soft due to not being cross-linked as a result of not undergoing a thermal treatment process. The solvent leaking into the under-layer 100A would have caused damage to the under-layer 100A. To prevent such solvent-induced damage, the low-temperature film 150 is formed according to various aspects of the present disclosure. The low-temperature film 150 does not contain a solvent, and therefore no solvent will be leaking into the under-layer 100A.

Since the surface 110A of the layer 100 has already been flattened by the polishing process 130, the low-temperature film 150 is also formed to have a substantially flat or planarized surface 180. The low-temperature film 150 has a thickness 190. As discussed above, the low-temperature film 150 is formed by a non-spin coating deposition process. For typical spin coating processes, there is a limitation as to how thin the film can be formed. Alternatively stated, a film formed by a spin coating process may not be thinner than a lower limit threshold, which may be a few hundred Angstroms. In comparison, the low-temperature film 150 herein can be formed quite thin since its formation does not involve a spin coating process. In some embodiments, the low-temperature deposition process 170 can achieve a range between about 10 Angstroms to about 300 Angstroms for the thickness 190. Such thin low-temperature film 150 is desirable, especially as the device scaling down process continues. Some aspects of the advantages of the thinness of the low-temperature film 150 will be discussed later.

Figure 6:
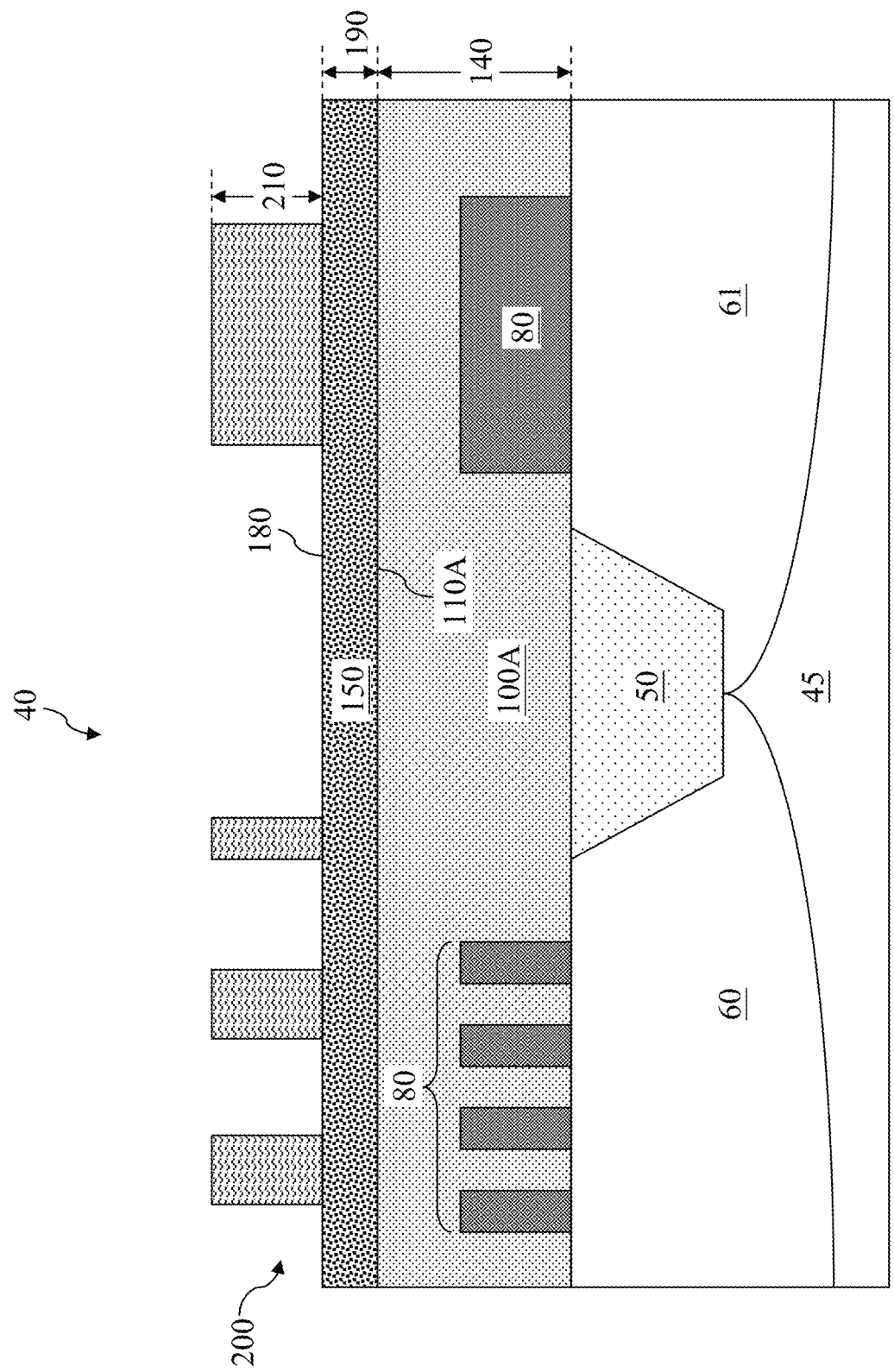

Referring now to FIG. 6, a patterned photoresist layer 200 is formed over the low-temperature film 150. The patterned photoresist layer 200 may be formed by forming a photoresist material on the film 150 (for example through a spin coating process), and thereafter patterning the photoresist material into a plurality of photoresist segments, thereby forming the patterned photoresist layer 200. The patterned photoresist layer 200 has a thickness 210. In some embodiments, the thickness 210 is in a range from about 500 to about 1000 Angstroms. The patterned photoresist layer 200 may constitute an upper layer of the tri-layer patterning scheme discussed above. Note that the photoresist segments of the patterned photoresist layer 200 shown in FIG. 6 are merely examples, and it is understood that an actual patterned photoresist layer may be configured into any suitable shape.

Figure 7:
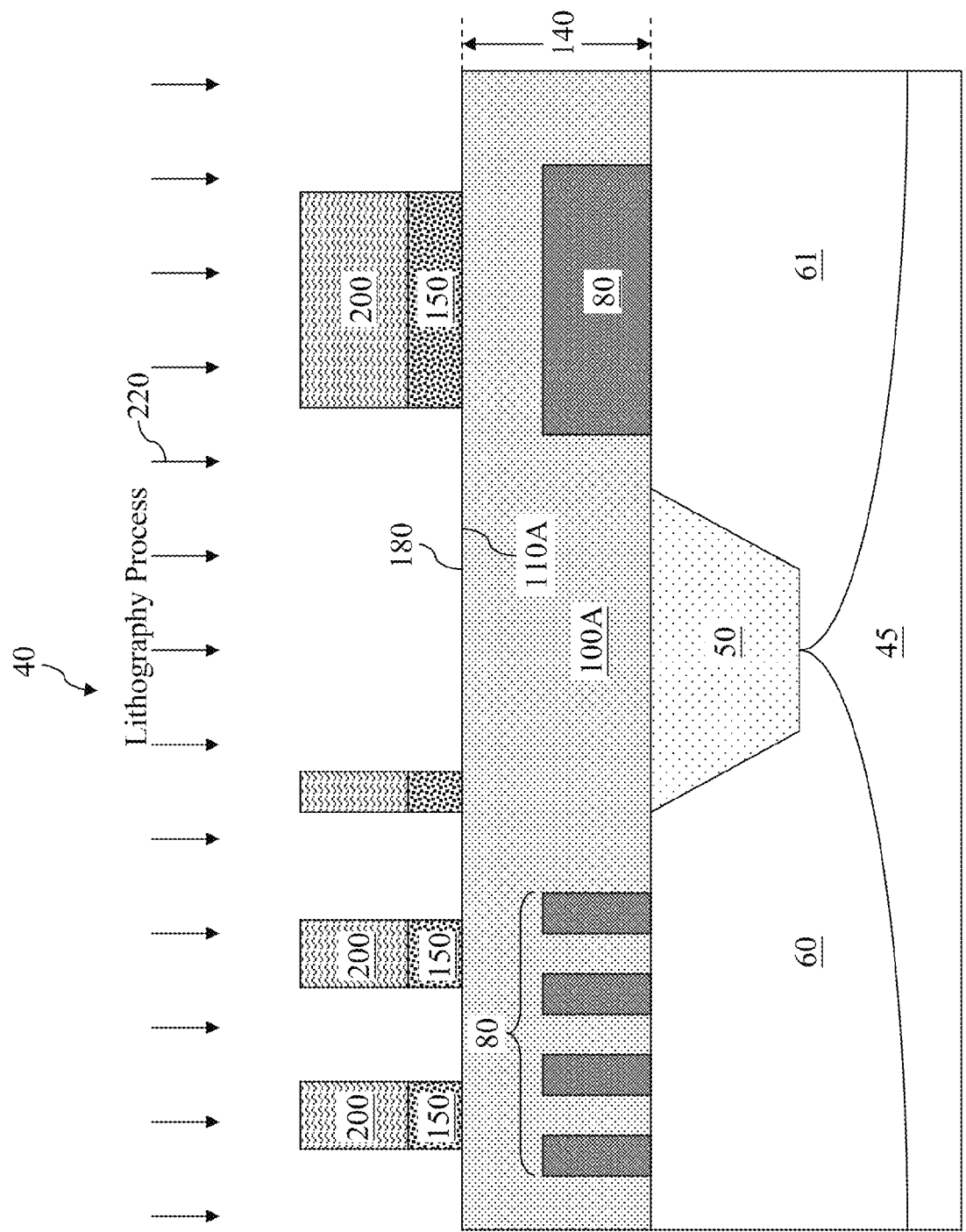

Referring now to FIG. 7, a lithography process 220 is performed to etch the patterns of the patterned photoresist layer 200 into the layers therebelow. The patterned photoresist layer 200 serves as an etching mask during the lithography process 220. For example, the lithography process 220 can etch openings into the film 150. The lithography process 220 can also etch openings into the layer 100A and/or the patterns 80. The material compositions for the film 150 and the layer 100A are chosen such that they have a high etching selectivity (measured by ratios of etching rates).

The thickness 210 of the photoresist layer 200 is correlated with the thicknesses 190 and 140 of the film 150 and the layer 100A. In other words, as the film 150 or the layer 100A become thicker, so does the photoresist layer 200. In traditional fabrication processes using a conventional tri-layer patterning scheme, the middle layer is formed by spin coating and is therefore somewhat thick. Consequently, the photoresist layer formed thereabove would have to be thick too. Meanwhile, as the device scaling down process continues, the patterns on the wafer have ever smaller lateral dimensions, thereby leading to smaller lateral dimensions (i.e., widths) for the photoresist patterns as well. As a result, an aspect ratio (height divided by width) of the photoresist patterns increase. It is difficult to form and maintain photoresist patterns with high aspect ratios, and the photoresist patterns with high aspect ratios may have a greater risk of collapsing too, which leads to fabrication defects.

In comparison, the film 150 (i.e., the middle layer of the tri-layer scheme of the present disclosure) is not formed by a spin coating process but by a low temperature deposition process 170. As such, the film 150 is substantially thinner than the middle layer for conventional tri-layer patterning schemes. The thinner film 150 allows the thickness 210 of the photoresist layer 200 to be reduced as well, thereby decreasing the aspect ratio of the photoresist layer 200. Therefore, the photoresist layer 200 herein is much less likely to collapse during a fabrication process.

Figure 8:
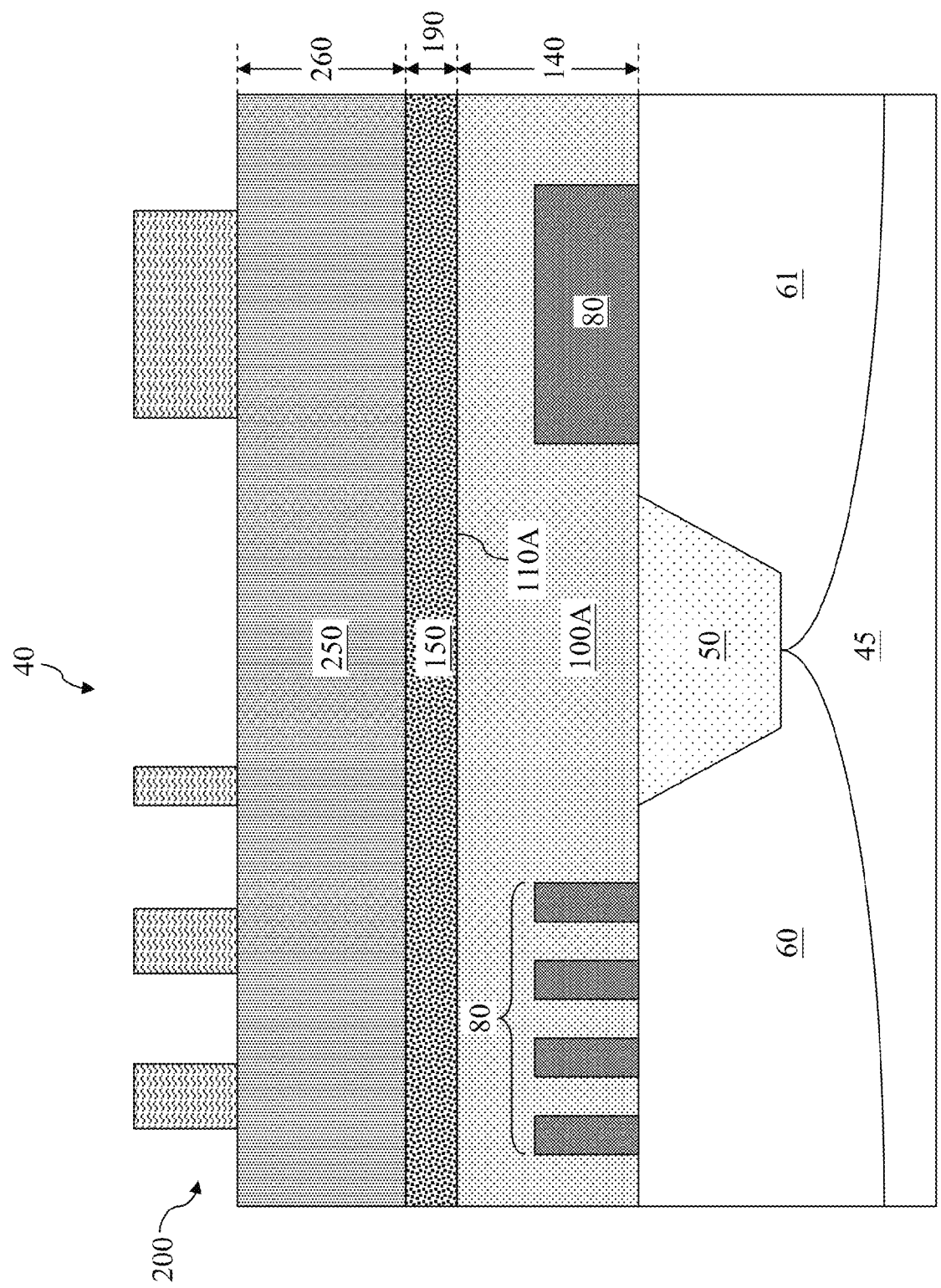

FIG. 8 illustrates a tetra-layer patterning scheme according to various aspects of the present disclosure. In addition to the layer 100A, the low-temperature film 150, the patterned photoresist layer 200, the tetra-layer patterning scheme includes an anti-reflective layer 250. In some embodiments, the anti-reflective layer 250 contains an organic material. The anti-reflective layer 250 has a thickness 260. In some embodiments, the thickness 260 is in a range from about 300 Angstroms to about 800 Angstroms. A high etching selectivity exists between the anti-reflective layer 250, the film 150, and the layer 100A. The tetra-layer patterning scheme illustrated in FIG. 8 may also undergo a lithography process similar to the lithography process 220 discussed above with reference to FIG. 7.

It is understood that additional processes may be performed thereafter (using either the tri-layer patterning scheme or the tetra-layer patterning scheme) to complete the fabrication of the semiconductor device 40. For example, these additional processes may include formation of interconnect structures (e.g., lines and vias, metal layers, and inter-layer dielectric that provide electrical interconnection to the device including the formed metal gate) if no interconnect structure has been formed yet, deposition of passivation layers, packaging, wafer dicing and testing. For the sake of simplicity, these additional processes are not described herein.

The embodiments of the present disclosure offers advantages, it being understood that different embodiments may offer different advantages, not all advantages are discussed herein, and that no particular advantage is required for all embodiments. One of the other advantages is that since the under layer does not undergo a thermal treatment process, its materials are not cross-linked and therefore remains soft. As such, the under layer can be effectively polished by a process such as a CMP process. The polishing of the under layer substantially reduces undesirable topography variations caused by the formation of device patterns below the under layer. In addition, the absence of a thermal treatment process itself reduces wafer topography variations, since wafer warpage may occur as a result of a thermal treatment.

Another advantage is that the low-temperature film (i.e., the middle layer) does not contain a solvent, and thus no solvent will permeate into the under layer to cause damages to the under layer.

Yet another advantage is that since the low-temperature film is formed without spin coating, it can be formed to be quite thin. Since the thickness of the photoresist layer formed over the low-temperature film is correlated with the thickness of the low-temperature film, the photoresist layer can be formed to be thinner too. The thinner photoresist layer entails a lower aspect ratio, thereby reducing the risk of photoresist collapse during fabrication.

Furthermore, the present disclosure can be easily integrated into existing process flow. Therefore, it may be easy to implement and does have a significant impact regarding fabrication costs.

One of the broader forms of the present disclosure involves a method of fabricating a semiconductor device. The method includes: forming a first patternable layer over a substrate and over the plurality of features; polishing the first patternable layer to flatten a surface of the first patternable layer, wherein a material of the first patternable layer is capable of being cross-linked but is free of being cross-linked during the polishing; and depositing a second patternable layer over the flattened surface of the first patternable layer, wherein the first and second patternable layers have different etching rates.

In some embodiments, the method further includes: forming a patterned photoresist layer over the second patternable layer; and performing a lithography process using the patterned photoresist layer as a mask.

In some embodiments, the method further includes: before the forming the patterned photoresist layer, forming an anti-reflective layer over the second patternable layer, wherein the anti-reflective layer and the first and second patternable layers have different etching rates, and wherein the photoresist layer is formed over the anti-reflective layer.

In some embodiments, the method further includes: forming a plurality of features over the substrate, wherein the first patternable layer is formed over the plurality of features.

In some embodiments, the depositing the second patternable layer is performed at a temperature cooler than a temperature of a chemical vapor deposition (CVD) chamber and a temperature of a physical vapor deposition (PVD) chamber.

In some embodiments, the temperature at which the second patternable layer is deposited is less than about 120 degrees Celsius.

In some embodiments, the depositing the second patternable layer is performed in a manner such that the second patternable layer has a thickness in a range from about 10 Angstroms to about 300 Angstroms.

In some embodiments, the depositing the second patternable layer is performed without spin coating.

In some embodiments, the first patternable layer contains an organic material; and the second patternable layer contains a LT-material.

Another of the broader forms of the present disclosure involves a method of fabricating a semiconductor device. The method includes: forming a plurality of patterns over a substrate; forming an organic layer over the substrate, the organic layer containing an un-cross-linked material and being formed over and around the plurality of patterns; performing a polishing process to the un-cross-linked material of the organic layer, the polishing process planarizing a surface of the organic layer; depositing a film over the planarized surface of the organic layer, wherein an etching selectivity exists between the film and the organic layer; and forming a photoresist layer over the film.

In some embodiments, the organic layer is free of thermal treatment before the polishing process is performed.

In some embodiments, the method further includes: forming an anti-reflective layer between the film and the photoresist layer, wherein an etching selectivity exists between the anti-reflective layer, the organic layer, and the film.

In some embodiments, the depositing the film is performed at a temperature ranging from about 30 degrees Celsius to about 120 degrees Celsius.

In some embodiments, the method further includes: performing an etching process to the film, wherein the photoresist layer serves as an etching mask during the etching process.

In some embodiments, the depositing the film is performed in a manner such that the film contains a dielectric material and has a thickness in a range from about 10 Angstroms to about 100 Angstroms.

In some embodiments, the depositing the film is performed without spin coating.

Still another of the broader forms of the present disclosure involves a method of fabricating a semiconductor device. The method includes: forming a plurality of circuit devices over a substrate; forming an organic layer over the substrate, the organic layer being formed over the plurality of circuit devices; polishing the organic layer to planarize a surface of the organic layer, wherein the organic layer is free of being thermally treated prior to the polishing, and wherein the organic material is un-cross-linked during the polishing; depositing a LT-film over the planarized surface of the organic layer, wherein the depositing is performed at a temperature less than about 150 degrees Celsius and without using a spin coating process; and forming a patterned photoresist layer over the LT-film.

In some embodiments, the method further includes: performing a photolithography process using the patterned photoresist layer as a mask.

In some embodiments, the method further includes: forming an anti-reflective layer between the dielectric film and the patterned photoresist layer, wherein an etching selectivity exists between the anti-reflective layer, the organic layer, and the dielectric film.

In some embodiments, the depositing the dielectric film is performed in a manner such that the dielectric film has a thickness in a range from about 10 Angstroms to about 100 Angstroms.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, the high voltage device may not be limited to an NMOS device and can be extended to a PMOS device with a similar structure and configuration except that all doping types may be reversed and dimensions are modified according to PMOS design. Further, the PMOS device may be disposed in a deep n-well pocket for isolating the device.

What is claimed is:

1. A method of fabricating a semiconductor device, comprising:
    forming a first layer of a multi-layer patterning scheme over a substrate such that a portion of the first layer physically contacts the substrate, wherein the multi-layer patterning scheme is used to perform a lithography process;
    polishing the first layer to planarize a surface of the first layer, wherein the first layer includes a material that is capable of being cross-linked but is free of being cross-linked during the polishing; and depositing a second layer of the multi-layer patterning scheme over the planarized surface of the first layer, wherein the second layer includes a solvent-free low temperature material.

2. The method of claim 1, further comprising:
forming a third layer of the multi-layer patterning scheme over the second layer, wherein the third layer includes a patterned photoresist layer; and
performing a lithography process using the patterned photoresist layer as a mask.

3. The method of claim 2, further comprising: before the forming the third layer, forming an anti-reflective layer over the second layer, wherein the anti-reflective layer and the first and second layers have different etching rates, and wherein the third layer is formed over the anti-reflective layer.

4. The method of claim 1, further comprising: forming a plurality of features over the substrate, wherein the first layer is formed over the plurality of features.

5. The method of claim 1, wherein: the depositing the second layer is performed at a temperature cooler than a temperature of a chemical vapor deposition (CVD) chamber and a temperature of a physical vapor deposition (PVD) chamber.

6. The method of claim 5, wherein the temperature at which the second layer is deposited is less than about 120 degrees Celsius.

7. The method of claim 1, wherein the depositing the second layer is performed in a manner such that the second layer has a thickness in a range from about 10 Angstroms to about 100 Angstroms.

8. The method of claim 1, wherein the depositing the second layer is performed without spin coating.

9. The method of claim 1, wherein:
the first layer contains an organic material; and
the second layer contains a LT-material.

10. A method of fabricating a semiconductor device, comprising:
forming a plurality of patterns over a substrate;
forming a first layer of a multi-layer patterning scheme over the substrate, wherein the first layer includes an organic layer free of thermal treatment and in physical contact with the substrate, and wherein the organic layer includes an un-cross-linked material;
polishing the organic layer prior to any thermal treatment, wherein the polishing process planarizes a surface of the organic layer;
depositing a second layer of the multi-layer patterning scheme over the planarized surface of the organic layer, wherein the second layer includes a low temperature film, and wherein an etching selectivity exists between the low temperature film and the organic layer; and
forming a third layer of the multi-layer patterning scheme over the second layer, wherein the third layer includes a photoresist layer.

11. The method of claim 10, further comprising: prior to forming the third layer, forming a fourth layer of the multi-layer patterning scheme over the second layer, wherein the fourth layer includes an anti-reflective layer, and wherein an etching selectivity exists between the anti-reflective layer, the organic layer, and the low temperature film.

12. The method of claim 10, wherein the depositing the second layer is performed at a temperature ranging from about 30 degrees Celsius to about 120 degrees Celsius.

13. The method of claim 10, further comprising: etching the second layer, wherein the photoresist layer serves as an etch mask during the etching of the second layer.

14. The method of claim 10, wherein the depositing the second layer is performed in a manner such that the second layer contains a dielectric material and has a thickness in a range from about 10 Angstroms to about 100 Angstroms.

15. The method of claim 10, wherein the depositing the second layer is performed without spin coating.

16. A method of fabricating a semiconductor device, comprising:
forming a plurality of circuit devices over a substrate, wherein the plurality of circuit devices include a conductive feature;
forming an un-cross-linked organic layer over the substrate, wherein the un-cross-linked organic layer includes a portion that physically contacts the conductive feature, wherein the un-cross-linked organic layer is a first layer of a multi-layer patterning scheme, and wherein the multi-layer patterning scheme is used to perform a lithography process;
polishing the un-cross-linked organic layer prior to any thermal treatment to planarize a surface of the un-cross-linked organic layer;
depositing a solvent-free low temperature film over the planarized surface of the un-cross-linked organic layer, wherein the solvent-free low temperature film is a second layer of the multi-layer patterning scheme; and
forming a patterned photoresist layer over the solvent-free low temperature film, wherein the patterned photoresist layer is a third layer of the multi-layer patterning scheme.

17. The method of claim 16, further comprising: performing a photolithography process using the patterned photoresist layer as a mask.

18. The method of claim 16, further comprising: prior to forming the patterned photoresist layer, forming an anti-reflective layer over the solvent-free low temperature film, wherein the anti-reflective layer is a fourth layer of the multi-layer patterning scheme, and wherein an etching selectivity exists between the anti-reflective layer, the un-cross-linked organic layer, and the solvent-free low temperature film.

19. The method of claim 16, wherein the depositing the solvent-free low temperature film is performed in a manner such that the solvent-free low temperature film has a thickness in a range from about 10 Angstroms to about 100 Angstroms.

20. The method of claim 16, wherein the depositing the solvent-free low temperature film is performed is performed at a temperature less than about 150 degrees Celsius and without using a spin coating process.

* * * * *